United States Patent
Dowell et al.

(10) Patent No.: US 12,532,426 B2
(45) Date of Patent: Jan. 20, 2026

(54) POWER DISTRIBUTION UNIT WITH SINGLE PIECE FRAME WITH INTEGRATED CABLE TROUGH, LIFTING HANDLES, AND OPTIONAL WELDED BASE

(71) Applicant: Vertiv Corporation, Columbus, OH (US)

(72) Inventors: Danny Dowell, Delaware, OH (US); Phillip Stiger, Marion, OH (US); Peter Alan Benner, Powell, OH (US); John Van Fossen, Powell, OH (US)

(73) Assignee: Vertiv Corporation, Westerville, OH (US)

( * ) Notice: Subject to any disclaimer, the term of this patent is extended or adjusted under 35 U.S.C. 154(b) by 161 days.

(21) Appl. No.: 18/584,938

(22) Filed: Feb. 22, 2024

(65) Prior Publication Data

US 2024/0349435 A1 Oct. 17, 2024

Related U.S. Application Data

(60) Provisional application No. 63/448,093, filed on Feb. 24, 2023.

(51) Int. Cl.
*H05K 5/02* (2006.01)
*H05K 5/03* (2006.01)
(Continued)

(52) U.S. Cl.
CPC ......... *H05K 5/0247* (2013.01); *H05K 5/0226* (2013.01); *H05K 5/023* (2013.01);
(Continued)

(58) Field of Classification Search
None
See application file for complete search history.

(56) References Cited

U.S. PATENT DOCUMENTS

| 5,398,833 | A | | 3/1995 | Klauss et al. |
| 6,036,290 | A | * | 3/2000 | Jancsek ................. H02B 1/301 |
| | | | | 312/265.3 |

(Continued)

FOREIGN PATENT DOCUMENTS

| EP | 0319483 A2 | 6/1989 |
| EP | 3029786 B1 | 9/2018 |
| FR | 2716791 A1 | 9/1995 |

*Primary Examiner* — Xanthia C Relford
*Assistant Examiner* — Xanthia C Cunningham
(74) *Attorney, Agent, or Firm* — Dickinson Wright PLLC

(57) ABSTRACT

An equipment cabinet frame is provided comprising first and second wrappers. The first wrapper extends from a rear edge at a rear side of the cabinet, is bent to form a first rear corner, extends across a first lateral side of the cabinet, and is bent to form a first front corner. The second wrapper extends from a rear edge at the rear side of the cabinet, is bent to form a second rear corner, extends across a second lateral side of the cabinet, and is bent to form a second front corner. A portion of the first wrapper extending from the front first corner to a first front edge is bent into a trough comprising a three-sided channel having an open side facing a front of the equipment cabinet. A top panel is mounted to top edges of the first and second wrappers. A bottom panel, and/or a bottom welded frame may be mounted to bottom edges of the first and second wrappers.

21 Claims, 6 Drawing Sheets

(51) Int. Cl.
  *H05K 5/04*  (2006.01)
  *H05K 5/10*  (2025.01)
(52) U.S. Cl.
  CPC ............ *H05K 5/03* (2013.01); *H05K 5/04* (2013.01); *H05K 5/10* (2025.01)

(56) References Cited

U.S. PATENT DOCUMENTS

| | | | | |
|---|---|---|---|---|
| 6,401,940 | B1* | 6/2002 | Hartel | H02B 1/301 |
| | | | | 361/829 |
| 6,785,459 | B2* | 8/2004 | Schmidt | H04Q 1/066 |
| | | | | 211/26 |
| 6,791,027 | B1* | 9/2004 | Nicolai | H02B 1/306 |
| | | | | 312/265.6 |
| 2008/0037228 | A1* | 2/2008 | Lewis, II | H05K 7/183 |
| | | | | 361/724 |

\* cited by examiner

POWER DISTRIBUTION UNIT WITH SINGLE PIECE FRAME WITH INTEGRATED CABLE TROUGH, LIFTING HANDLES, AND OPTIONAL WELDED BASE

CROSS-REFERENCES TO RELATED APPLICATIONS

This patent application claims priority to U.S. Provisional Patent Application Ser. No. 63/448,093, filed Feb. 24, 2023, which is incorporated herein by reference in its entirety.

BACKGROUND

1. Field

Apparatuses and methods consistent with example embodiments relate to electrical/electronics equipment units, and more particularly to an electrical/electronics power distribution unit with a single piece frame with an integrated cable trough, lifting handles, and an optional welded base.

2. Description of Related Art

Power distribution equipment units are typically used to receive output power from a power transformer cabinet and to distribute the received power, via a plurality of output distribution power cables, to a plurality of different power output panelboards. Such power distribution units (PDUs), with built-in monitoring and controls, require printed circuit boards, power supplies, and other electronic modules which are installed in the unit in secure and protected locations. Field input power cables are required to provide energy to the PDU. These input cables may be in a size range of about 1/0 AWG to 600 Kcmil size range, with compression/mechanical lugs. Thus, these lugs and cables are large and take up a significant amount of space within the PDU. There may be three to five conductors per input, including, for example, phase A/1, B/2, C/3, neutral, and ground conductors. The lugs of these input cables and the busbar they connect to are live parts with hazardous voltage on them.

The design of a PDU requires integration of high voltage and low voltage cable over a range of installation conditions and users. Some installations require seismic certification which requires an increase in the strength, and therefore the cost, of the design. Some are installed in tight areas precluding the use of lifting equipment, and virtually all installations require control cable in addition to power cabling. There is a desire for a design of an electric/electronics cabinet which can reduce system costs and assembly complexity while easing installation in a variety of conditions.

SUMMARY

Example embodiments may address at least the above problems and/or disadvantages and other disadvantages not described above. Also, example embodiments are not required to overcome the disadvantages described above, and may not overcome any of the problems described above.

According to an aspect of an example embodiment, an equipment cabinet frame comprises: a first wrapper comprising a first sheet of metal which comprises a first rear edge, a bent first rear corner, a bent first front corner, and a first front edge, wherein a portion of the first wrapper extending from the first rear edge to the first rear corner forms a portion of a rear side of the equipment cabinet, and a portion of the first wrapper extending from the first rear corner to the first front corner forms a first lateral side of the equipment cabinet; a second wrapper comprising a second sheet of metal which comprises a second rear edge, a bent second rear corner, a bent second front corner, and a second front edge, wherein a portion of the second wrapper extending from the second rear edge to the second rear corner forms a portion of the rear side of the equipment cabinet, and a portion of the second wrapper extending from the second rear corner to the second front corner forms a second lateral side of the equipment cabinet; a top panel mounted to a top edge of the first wrapper and to a top edge of the second wrapper; and a trough comprising a portion of the first wrapper extending from the first front corner to the first front edge which is bent into a three-sided channel having an open side facing a front of the equipment cabinet.

The equipment cabinet frame may further comprise: a door moveably mounted to one of the front edge of the first wrapper and the front edge of the second wrapper.

The equipment cabinet frame may further comprise a plurality of hinges, wherein the door is attached to the front edge of the first wrapper by the plurality of hinges.

The equipment cabinet frame may further comprise: a bottom frame comprising a welded metal attached to a bottom edge of the first wrapper and a bottom edge of the second wrapper.

The equipment cabinet frame may further comprise a bottom panel mounted to the bottom frame and forming a bottom side of the equipment cabinet.

The equipment cabinet frame may further comprise: a rear panel mounted to the rear edge of the first wrapper and to the rear edge of the second wrapper and spanning a space, across the rear side of the equipment cabinet, from the rear edge of the first wrapper and the rear edge of the second wrapper.

The first wrapper and the second wrapper may together comprise a single unit of sheet metal.

The equipment cabinet frame may further comprise: at least one hole formed through at least one side of the three-sided channel of the trough.

The equipment cabinet frame may further comprise: a conduit landing box mounted to an upper edge of the trough and comprising: an open bottom side enabling communication between an interior of the trough and an interior of the conduit landing box, and an opening formed through at least one of a plurality of lateral sides thereof and the top side thereof.

The equipment cabinet frame may further comprise: a handle removeably mounted to at least one of the first lateral side, the second lateral side, and the rear side.

The equipment cabinet frame may further comprise: a cable protection device comprising: routing plate mounted to at least one of the first lateral side and the rear side, the routing plate having formed thereon a plurality of lances, and cover bracket mounted over and thereby covering at least the plurality of lances of the routing plate.

According to an aspect of another example embodiment, a method of forming a frame of an equipment cabinet may comprise: providing a first wrapper comprising a first sheet of metal which comprises a first rear edge, a bent first rear corner, a bent first front corner, and a first front edge, wherein a portion of the first wrapper extending from the first rear edge to the first rear corner forms a portion of a rear side of the equipment cabinet, and a portion of the first wrapper extending from the first rear corner to the first front corner forms a first lateral side of the equipment cabinet; providing a second wrapper comprising a second sheet of metal which comprises a second rear edge, a bent second rear corner, a bent second front corner, and a second front edge, wherein a portion of the second wrapper extending from the second rear edge to the second rear corner forms a portion of the rear side of the equipment cabinet, and a portion of the second wrapper extending from the second rear corner to the second front corner forms a second lateral side of the equipment cabinet; and mounting a top panel to a top edge of the first wrapper and to a top edge of the second wrapper; and wherein a trough comprises a portion of the first wrapper extending from the first front corner to the first front edge which is bent into a three-sided channel having an open side facing a front of the equipment cabinet.

BRIEF DESCRIPTION OF THE DRAWINGS

The above and/or other aspects will become apparent and more readily appreciated from the following description of example embodiments, taken in conjunction with the accompanying drawings, in which.

DETAILED DESCRIPTION

Figure 1:
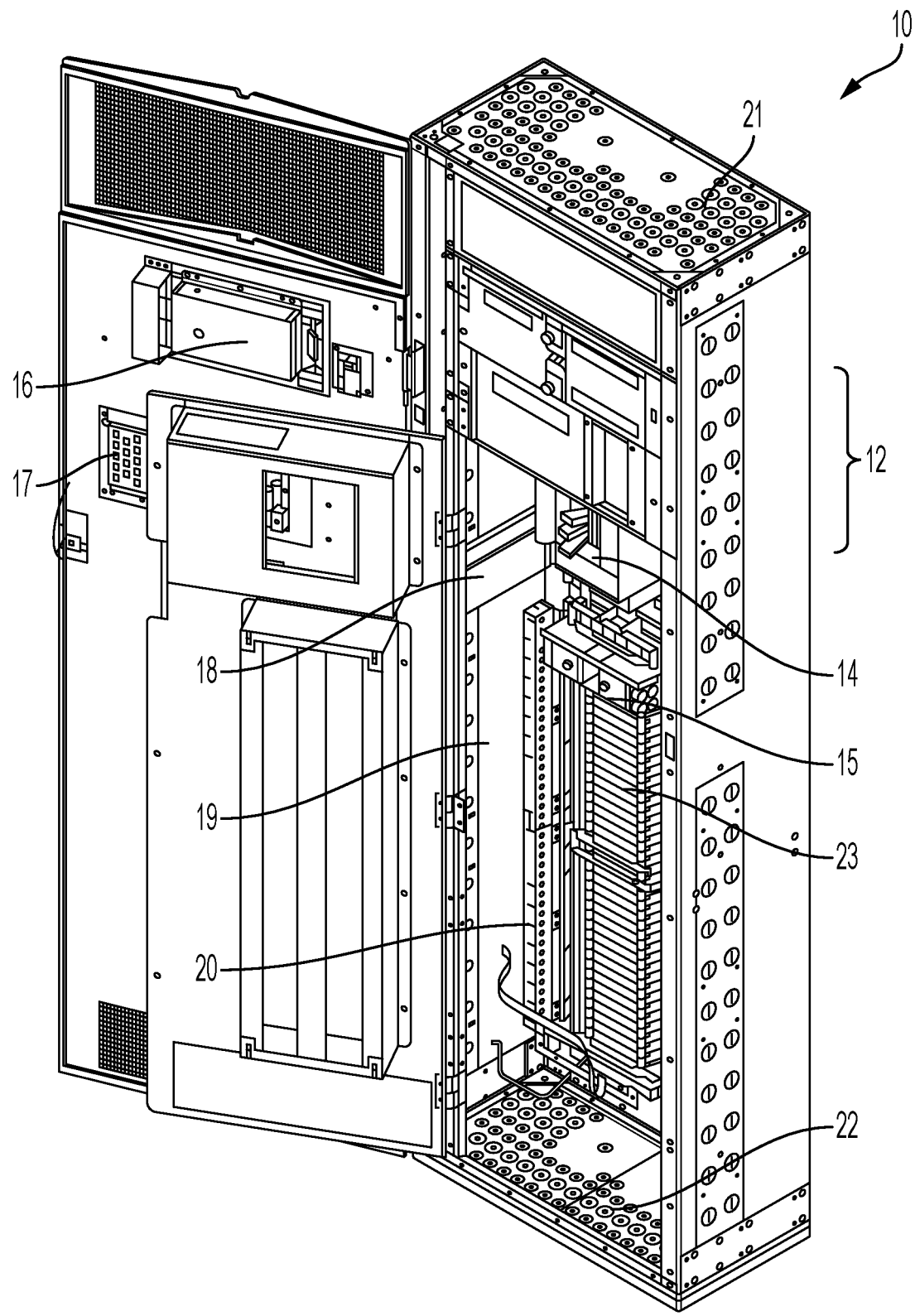
FIG. 1 is a perspective view of an electrical/electronics equipment cabinet 10 according to an example embodiment.

Reference will now be made in detail to example embodiments which are illustrated in the accompanying drawings, wherein like reference numerals refer to like elements throughout. In this regard, the example embodiments may have different forms and may not be construed as being limited to the descriptions set forth herein.

It will be understood that the terms "include," "including," "comprise," and/or "comprising," when used in this specification, specify the presence of stated features, integers, steps, operations, elements, and/or components, but do not preclude the presence or addition of one or more other features, integers, steps, operations, elements, components, and/or groups thereof.

It will be further understood that, although the terms "first," "second," "third," etc., may be used herein to describe various elements, components, regions, layers and/or sections, these elements, components, regions, layers and/or sections may not be limited by these terms. These terms are only used to distinguish one element, component, region, layer or section from another element, component, region, layer or section.

As used herein, the term "and/or" includes any and all combinations of one or more of the associated listed items. Expressions such as "at least one of," when preceding a list of elements, modify the entire list of elements and do not modify the individual elements of the list.

Various terms are used to refer to particular system components. Different companies may refer to a component by different names—this document does not intend to distinguish between components that differ in name but not function.

Matters of these example embodiments that are obvious to those of ordinary skill in the technical field to which these example embodiments pertain may not be described herein in detail.

A related art cabinet is generally constructed using a riveted and/or welded frame in which exterior doors and panels are attached to the frame to form the body and structure of the PDU. Such a frame structure may consist of six or more punched and formed sheet metal pieces including four upright pieces which are secured to a top frame and bottom frame to provide the unit frame. The unit frame is then enclosed using additional sheet metal components, such as doors and panels, to create a system with structure, form, and enclosure. One or more example embodiments described herein may eliminate the need for upright frame members and a non-limiting example unit may include two punched and formed sheet metal wrapper components that provide unit structure and form. The wrapper may then be riveted or welded to top and bottom frame components to make up the structure and enclose the PDU. Such a system may allow for different width systems to be assembled using the same wrappers with wider or narrower top and bottom frame components.

One or more example embodiments described herein provide a single piece frame that may simplify and reduce labor for system assembly. An integrated cable trough may provide a dedicated protected space for routing low voltage control cables separate from high voltage power cables. Removable lifting handles may provide options for uses that have limited space or equipment to install the unit in its operating location. An optional welded base may provide increased strength and allow the system to withstand seismic events without burdening the stand design with additional costs.

Referring to FIG. 1, an example electrical/electronics equipment cabinet 10 (hereinafter simply "cabinet 10") is shown. The cabinet 10 includes customer cable input and output areas 21 and 22 at the top and bottom of the cabinet 10, respectively. The cabinet 10 also includes a control area 12, a main input circuit breaker 14, output circuit breakers 15, an output panel board 23, current transformers/sensors 20, a customer cable routing area 19, a control and sense wiring routing trough 18, remote communication cards 17, and a human machine interface 16.

Figure 2:
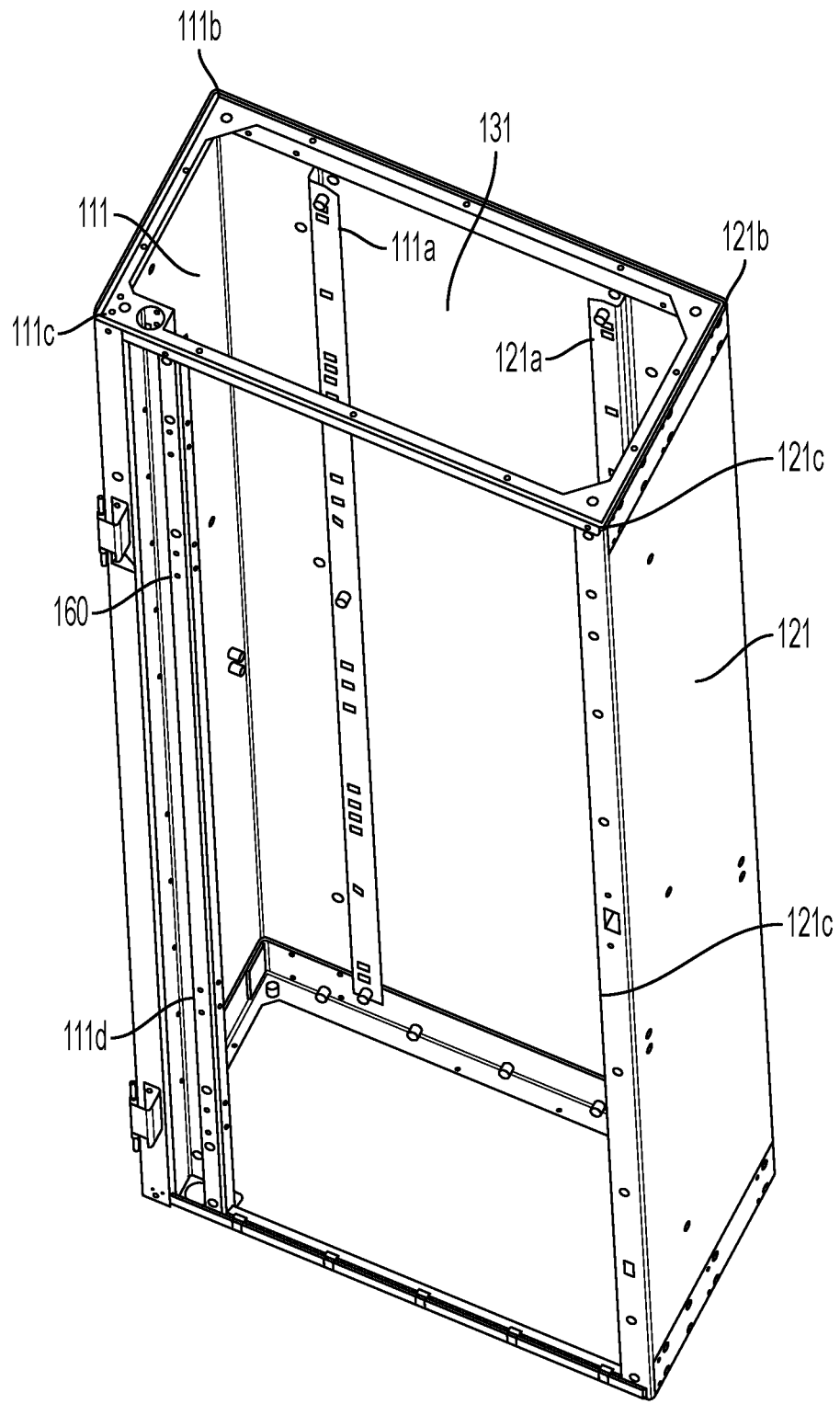
FIG. 2 is a perspective view of portion of a frame of a cabinet according to an example embodiment.

FIG. 2 is a perspective view of portion of a frame of a cabinet according to an example embodiment. As shown, the design of FIG. 2 includes a first (e.g., left) wrapper 111 and a second (e.g., right) wrapper 121. The first wrapper extends from a rear edge 111a, forms a portion of a rear side 130 of the cabinet, bends to form a first rear corner 111b, extends as a first lateral side of the cabinet, and bends to form a first front corner 111c. The second wrapper 121 extends from a rear edge 121a, forms a portion of a rear side of the cabinet, bends to form a second rear corner 121b, extends as a second lateral side of the cabinet, and bends to form a second front corner 121c. A rear panel 131 may extend across the rear side 130 of the cabinet, bridging the space between the rear edge 11a of the first wrapper 111 and the rear edge 121a of the second wrapper 121. The rear panel 131 may be attached to both the first wrapper 111 and the second wrapper 121 using bolts, rivet fasteners, or the like.

Additionally, the design includes an integrated low voltage cable trough 160 which is integrated into the first wrapper 111. The trough is formed by folding the sheet metal of a front edge of the first wrapper 111 to form a trough 160 along a front side 111d of the first wrapper 111. This trough 160 enables separation of the control wiring, which can run through the trough 160 from high voltage wiring maintained internal to the unit itself.

The trough 160 may have a substantially U-shaped cross section, which may be squared at the corners, or rounded. The trough 160 may run the entire height of the system from bottom to top, or may extend along only a portion of the height of the system. There may, additionally, be one or more holes, formed in the sheet metal of the trough 160 to enable one or more cables to pass through to a control panel on an internal door, or to permit access to an interior of the trough 160. As shown in FIG. 2, the trough 160 may be integrated into the first wrapper 111, but may alternately be integrated into the second wrapper 121. Finally, if desired, two troughs may be formed, with one integrated into each of the first and second wrappers 111, 121.

According to another example embodiment, the first lateral side 110, the rear side 130, and the second lateral side 120 of the cabinet 100 may be made from a single sheet of metal extending from a first front lateral edge, around a first front corner, across the first lateral side 110, around a first rear corner, across the rear side 130, around a second rear corner, across the second lateral side 120, and around the second front corner. In other words, rather than three separate pieces, the first wrapper, the rear panel, and the second wrapper may be a single, unitary piece.

Figure 3:
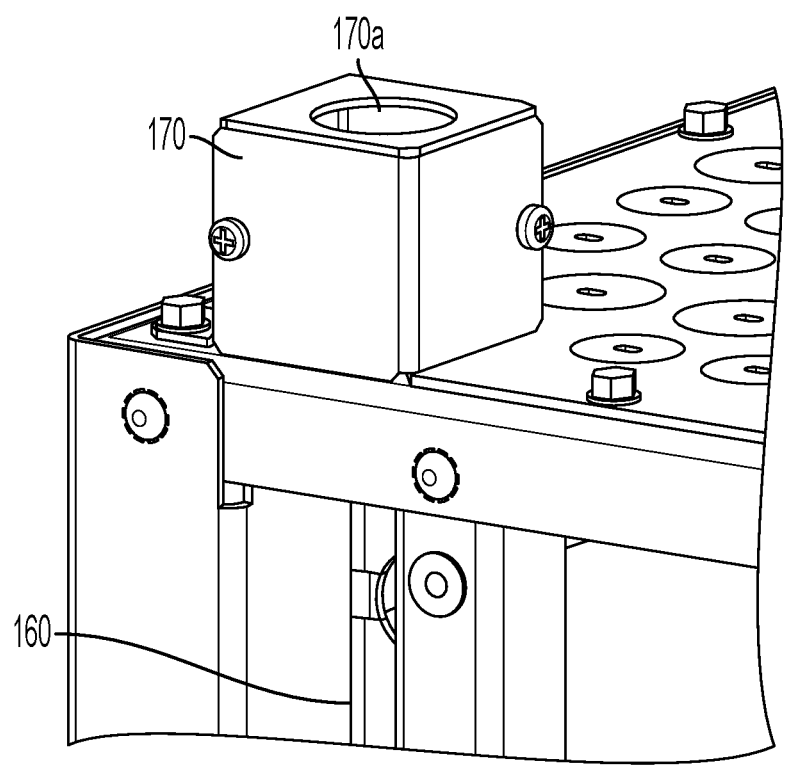
FIG. 3 illustrates a perspective view of a top end of a trough and a landing box, according to an example embodiment.

According to one or more example embodiments, a conduit landing box 170 may be provided at an upper end of the trough 160. FIG. 3 illustrates a perspective view of a top end of a trough 160 and a landing box 170, according to an example embodiment. The landing box 170 may be made of steel, and may be attached to the top end of the trough 160 by welding or using one or more bolts, rivet fasteners, or screws, as would be understood by one of skill in the art. As shown, the landing box 170 may be substantially cube-shaped with an open, or partially-open, bottom side to allow an interior of the box 170 to be in communication with the trough 160, and may have a further opening 170a on a top side. This landing box 170 enables a customer to secure an electrical conduit, whether metallic or not or flexible or not, to the unit, and to run one or more customer cables or wiring in the unit.

According to one or more example embodiments, the design may additionally include one or more cable protection devices for internal control wiring. In some designs, a monitoring system is used to monitor current, voltage, breaker status, and trip, and/or other elements or status. Such a monitoring system often requires control cabling to be routed from the panelboard and main breaker area around a side of the unit and to the one or more control boards located in the control door. Such routing may expose the cables to damage caused by installing contractors and external power cables entering and exiting the unit. According to an example embodiment, a dedicated route and cable cover may be provided to protect the routed cables.

Figure 4:
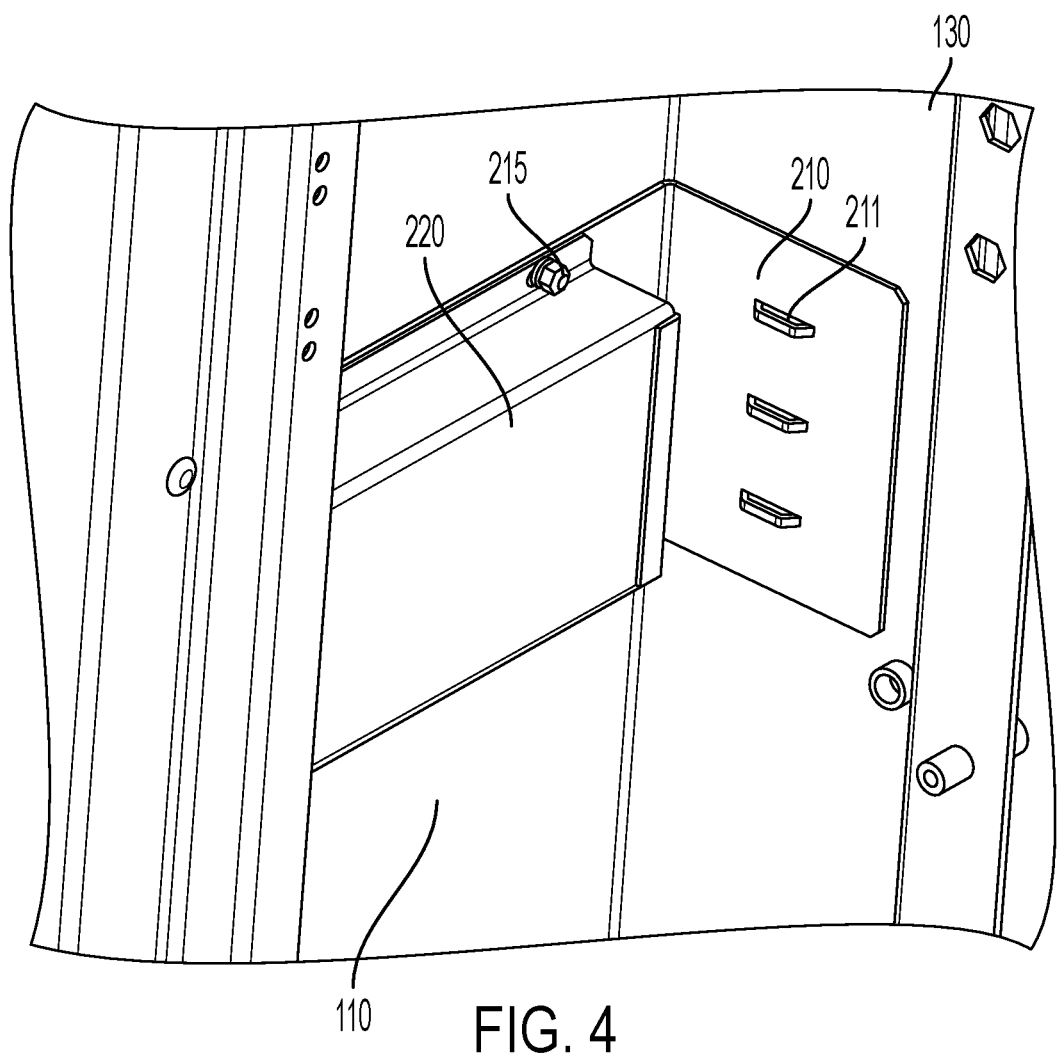
FIGS. 4 and 5 are perspective views of a cable protection device according to an example embodiment.
Figure 5:
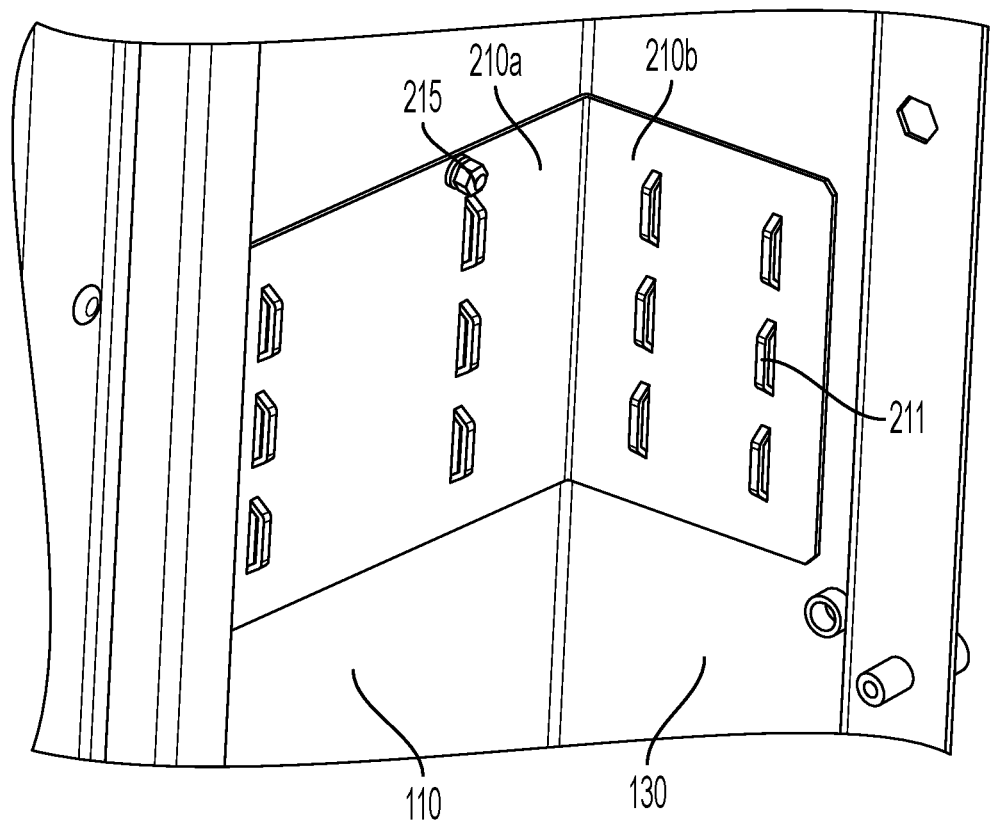

An example embodiment of a cable protection device is shown in the cabinet of FIG. 1. FIGS. 4 and 5 are perspective views of a cable protection device according to an example embodiment. The cable protection device includes two main components: a routing plate 210, and a cover bracket 220. The routing plate 210 may be a piece of sheet metal which is bent, such that a first portion 210a abuts the rear side 130 of the cabinet 100, and a second portion 210b abuts a first lateral side 110 of the cabinet 100. The routing plate 210 is also bent and cut to include lances 211 to which control wiring/cables may be attached, e.g., using zip ties or the like. The cover bracket 220 may be installed over one of the portions of the routing plate 210 after cables have been secured to the routing plate 210. The routing plate 210 and the cover bracket 220 may be attached to the rear side 120 and/or the first lateral side 110 of the cabinet 100 using bolts or rivet fasteners 215 or via another attachment method as would be understood by one of skill in the art.

Figure 6:
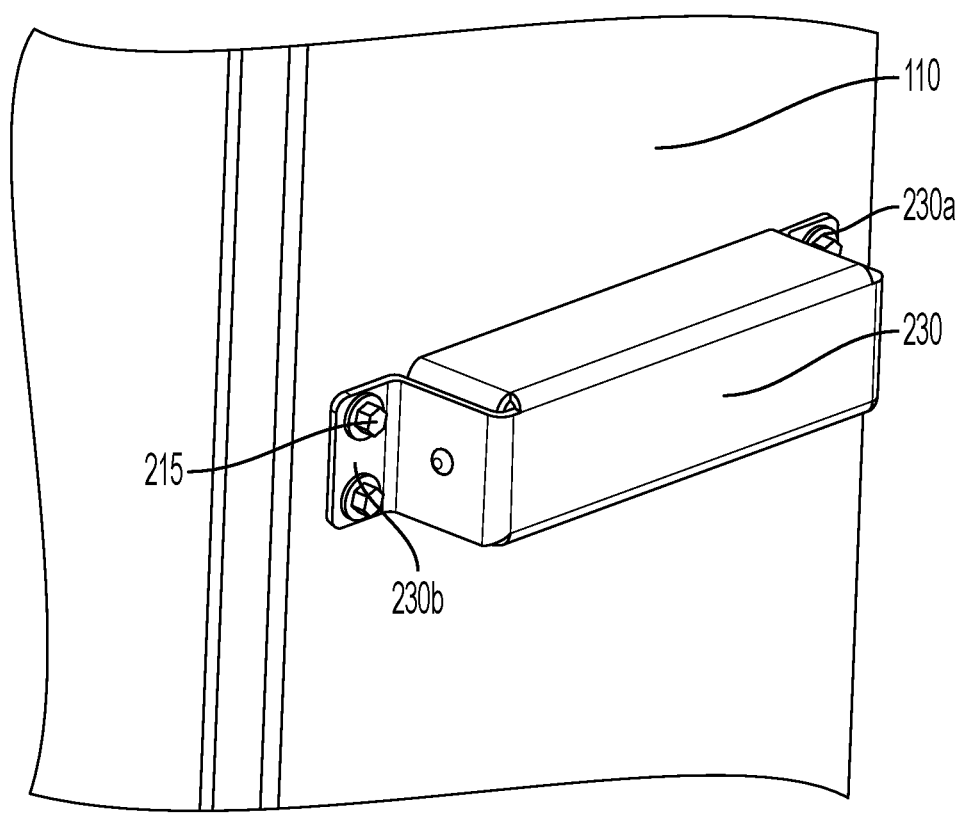
FIG. 6 is a perspective view of a portion of a lifting handle 230 according to an example embodiment.

According to one or more example embodiments, the design may additionally include one or more removable lifting handles. FIG. 6 is a perspective view of a portion of a lifting handle 230 according to an example embodiment. A lifting handle 230 may be formed of a single piece of sheet metal that is folded to substantially form a hexahedron with first and second extensions 230a, as shown. Alternately, the lifting handle may be formed of a single piece of sheet metal bent into a different shape, with or without extensions. The handle 230 may be attachable to a first lateral side 110 of a cabinet using bolts or rivet fasteners 215 or the like, as would be understood by one of skill in the art. Alternately, one or more handles 230 may be attached to a second lateral side 130, to a rear side 120, or to any other portion of the cabinet 100, as would be convenient. Any one or more handles 230 may be attached to a cabinet 100 for use in lifting and positioning the cabinet 100, and may be removable when not needed.

According to one or more example embodiments, the design may additionally include a welded base. Thus, the bottom panel 151, as shown in FIG. 1 may include a welded frame member that is bolted to the lower edges of the first lateral panel 111 and the second lateral panel 121. The addition of this bottom panel 151 and bottom welded frame which may be omitted in other example embodiments, adds strength and rigidity to the cabinet as a whole. The bottom welded frame may be included when needed for seismic rating, or for other additional needs for strength and rigidity, and may be omitted when not needed, in order to save cost.

It may be understood that the example embodiments described herein may be considered in a descriptive sense only and not for purposes of limitation. Descriptions of features or aspects within each example embodiment may be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. An equipment cabinet frame comprising:
   a first wrapper comprising a first sheet of metal which comprises a first rear edge, a bent first rear corner, a bent first front corner, and a first front edge, wherein a portion of the first wrapper extending from the first rear edge to the first rear corner forms a portion of a rear side of the equipment cabinet, and a portion of the first wrapper extending from the first rear corner to the first front corner forms a first lateral side of the equipment cabinet;
   a second wrapper comprising a second sheet of metal which comprises a second rear edge, a bent second rear corner, a bent second front corner, and a second front edge, wherein a portion of the second wrapper extending from the second rear edge to the second rear corner forms a portion of the rear side of the equipment cabinet, and a portion of the second wrapper extending from the second rear corner to the second front corner forms a second lateral side of the equipment cabinet;

a top panel mounted to a top edge of the first wrapper and to a top edge of the second wrapper; and a trough comprising a portion of the first wrapper extending from the first front corner to the first front edge which is bent into a three-sided channel having an open side facing a front of the equipment cabinet.

2. The equipment cabinet frame of claim 1, further comprising:

a door moveably mounted to one of the front edge of the first wrapper and the front edge of the second wrapper.

3. The equipment cabinet frame of claim 2, further comprising a plurality of hinges, wherein the door is attached to the front edge of the first wrapper by the plurality of hinges.

4. The equipment cabinet frame of claim 1, further comprising:

a bottom frame comprising a welded metal attached to a bottom edge of the first wrapper and a bottom edge of the second wrapper.

5. The equipment cabinet of claim 4, further comprising a bottom panel mounted to the bottom frame and forming a bottom side of the equipment cabinet.

6. The equipment cabinet frame of claim 1, further comprising:

a rear panel mounted to the rear edge of the first wrapper and to the rear edge of the second wrapper and spanning a space, across the rear side of the equipment cabinet, from the rear edge of the first wrapper and the rear edge of the second wrapper.

7. The equipment cabinet of claim 1, wherein the first wrapper and the second wrapper together comprise a single unit of sheet metal.

8. The equipment cabinet frame of claim 1, further comprising:

at least one hole formed through at least one side of the three-sided channel of the trough.

9. The equipment cabinet frame of claim 1, further comprising:

a conduit landing box mounted to an upper edge of the trough and comprising:

an open bottom side enabling communication between an interior of the trough and an interior of the conduit landing box, and an opening formed through at least one of a plurality of lateral sides thereof and the top side thereof.

10. The equipment cabinet frame of claim 1, further comprising:

a handle removeably mounted to at least one of the first lateral side, the second lateral side, and the rear side.

11. The equipment cabinet frame of claim 1, further comprising:

a cable protection device comprising:

routing plate mounted to at least one of the first lateral side and the rear side, the routing plate having formed thereon a plurality of lances, and cover bracket mounted over and thereby covering at least the plurality of lances of the routing plate.

12. A method of forming a frame of an equipment cabinet, the method comprising:

providing a first wrapper comprising a first sheet of metal which comprises a first rear edge, a bent first rear corner, a bent first front corner, and a first front edge, wherein a portion of the first wrapper extending from the first rear edge to the first rear corner forms a portion of a rear side of the equipment cabinet, and a portion of the first wrapper extending from the first rear corner to the first front corner forms a first lateral side of the equipment cabinet;

providing a second wrapper comprising a second sheet of metal which comprises a second rear edge, a bent second rear corner, a bent second front corner, and a second front edge, wherein a portion of the second wrapper extending from the second rear edge to the second rear corner forms a portion of the rear side of the equipment cabinet, and a portion of the second wrapper extending from the second rear corner to the second front corner forms a second lateral side of the equipment cabinet; and mounting a top panel to a top edge of the first wrapper and to a top edge of the second wrapper; and wherein a trough comprises a portion of the first wrapper extending from the first front corner to the first front edge which is bent into a three-sided channel having an open side facing a front of the equipment cabinet.

13. The method of claim 12, further comprising:

moveably mounting a door to one of the front edge of the first wrapper and the front edge of the second wrapper.

14. The method of claim 13, wherein the moveably mounting the door comprises mounting the door to the one of the front edge of the first wrapper and the front edge of the second wrapper via a plurality of hinges.

15. The method of claim 12, further comprising mounting a bottom frame, comprising welded metal, to a bottom edge of the first wrapper and a bottom edge of the second wrapper.

16. The method of claim 15, further comprising mounting a bottom panel to the bottom frame.

17. The method of claim 12, further comprising mounting a rear panel to the rear edge of the first wrapper and to the rear edge of the second wrapper such that the rear panel spans a space across the rear side of the equipment cabinet, from the rear edge of the first wrapper and the rear edge of the second wrapper.

18. The method of claim 12, wherein the first wrapper and the second wrapper together comprise a single unit of sheet metal.

19. The method of claim 12, wherein at least one hole is formed through at least one side of the three-sided channel of the trough.

20. The method of claim 12, further comprising, mounting a conduit landing box to an upper edge of the trough, the conduit landing box comprising:

an open bottom side enabling communication between an interior of the trough and an interior of the conduit landing box, and an opening formed through at least one of a plurality of lateral sides thereof and the top side thereof.

21. The method of claim 12, further comprising removable attaching a handle to at least one of the first lateral side, the second lateral side, and the rear side.

* * * * *